United States Patent [19]

Tamura

[11] Patent Number: 5,563,419
[45] Date of Patent: Oct. 8, 1996

[54] ELECTRON BEAM EXPOSURE SYSTEM CAPABLE OF CORRECTING PROXIMITY EFFECT

[75] Inventor: Takao Tamura, Tokyo, Japan

[73] Assignee: NEC Corporation, Tokyo, Japan

[21] Appl. No.: 451,076

[22] Filed: May 25, 1995

[30] Foreign Application Priority Data

May 25, 1994 [JP] Japan .................. 6-110646

[51] Int. Cl.$^6$ .................. H01J 37/302
[52] U.S. Cl. .................. 250/492.22; 250/398
[58] Field of Search .................. 250/492.22, 398, 250/492.23, 492.2

[56] References Cited

U.S. PATENT DOCUMENTS

| 4,291,231 | 9/1981 | Kawashima et al. | 250/492.22 |
| 4,532,598 | 7/1985 | Shibayama et al. | 250/492.22 |
| 5,241,185 | 8/1993 | Meiri et al. | 250/492.22 |
| 5,278,421 | 1/1994 | Yoda et al. | 250/398 |
| 5,313,068 | 5/1994 | Meiri et al. | 250/492.22 |

FOREIGN PATENT DOCUMENTS

| 3-17471 | 7/1991 | Japan . |
| 4-137520 | 5/1992 | Japan . |
| 6-13301 | 1/1994 | Japan . |

OTHER PUBLICATIONS

T. Abe et al., "Representative Figure Method for Proximity Effect Correction", *Japanese Journal of Applied Physics*, vol. 30, No. 38, Mar. 1991, pp. L528–L531.

F. Murai et al., "Fast proximity effect correction method using a pattern area density map", *J. Vac. Sci. Technol. B*, vol. 10, No. 6, Nov./Dec. 1992, pp. 3072–3076.

Primary Examiner—Jack I. Berman
Assistant Examiner—Kiet T. Nguyen
Attorney, Agent, or Firm—Sughrue, Mion, Zinn, Macpeak & Seas

[57] ABSTRACT

In an electron beam exposure system, an electron beam is adjusted and is irradiated onto a number of pattern openings of a mask. The electron beam passed through the number of the pattern openings is deflected by deflection units and is irradiated onto a resist-coated target. The target is divided into a plurality of sub areas whose size corresponds to the size of the pattern openings. Exposure times are calculated for the sub areas so that energy deposited in the resist of the target is brought close to a definite energy.

9 Claims, 16 Drawing Sheets

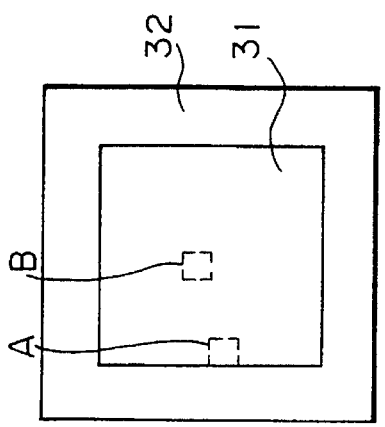
Fig. 3 PRIOR ART
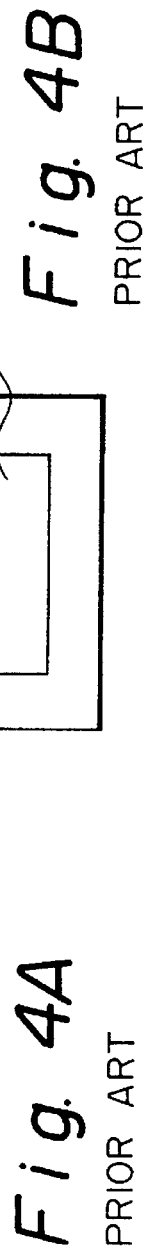
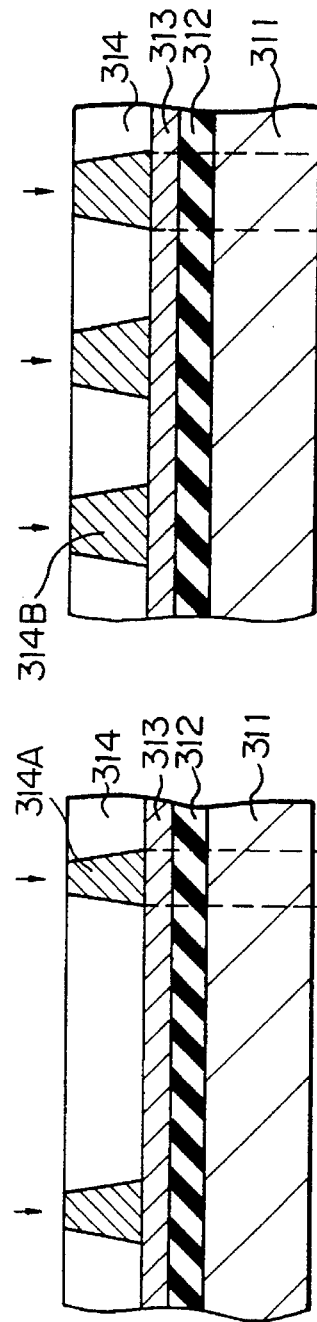
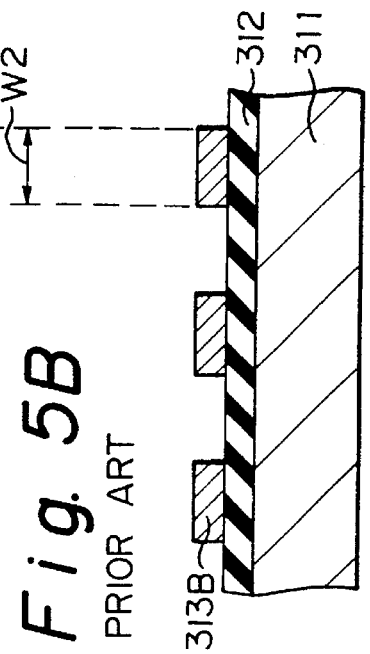
Fig. 4A PRIOR ART
Fig. 4B PRIOR ART
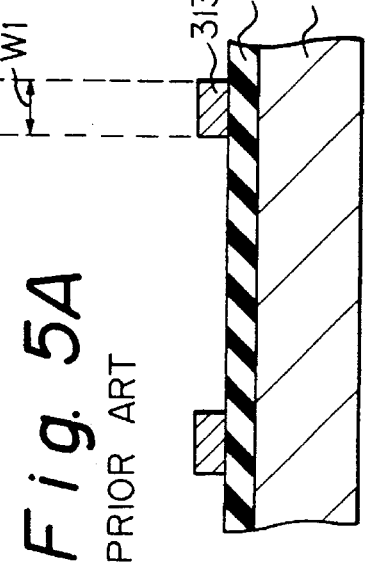
Fig. 5A PRIOR ART
Fig. 5B PRIOR ART

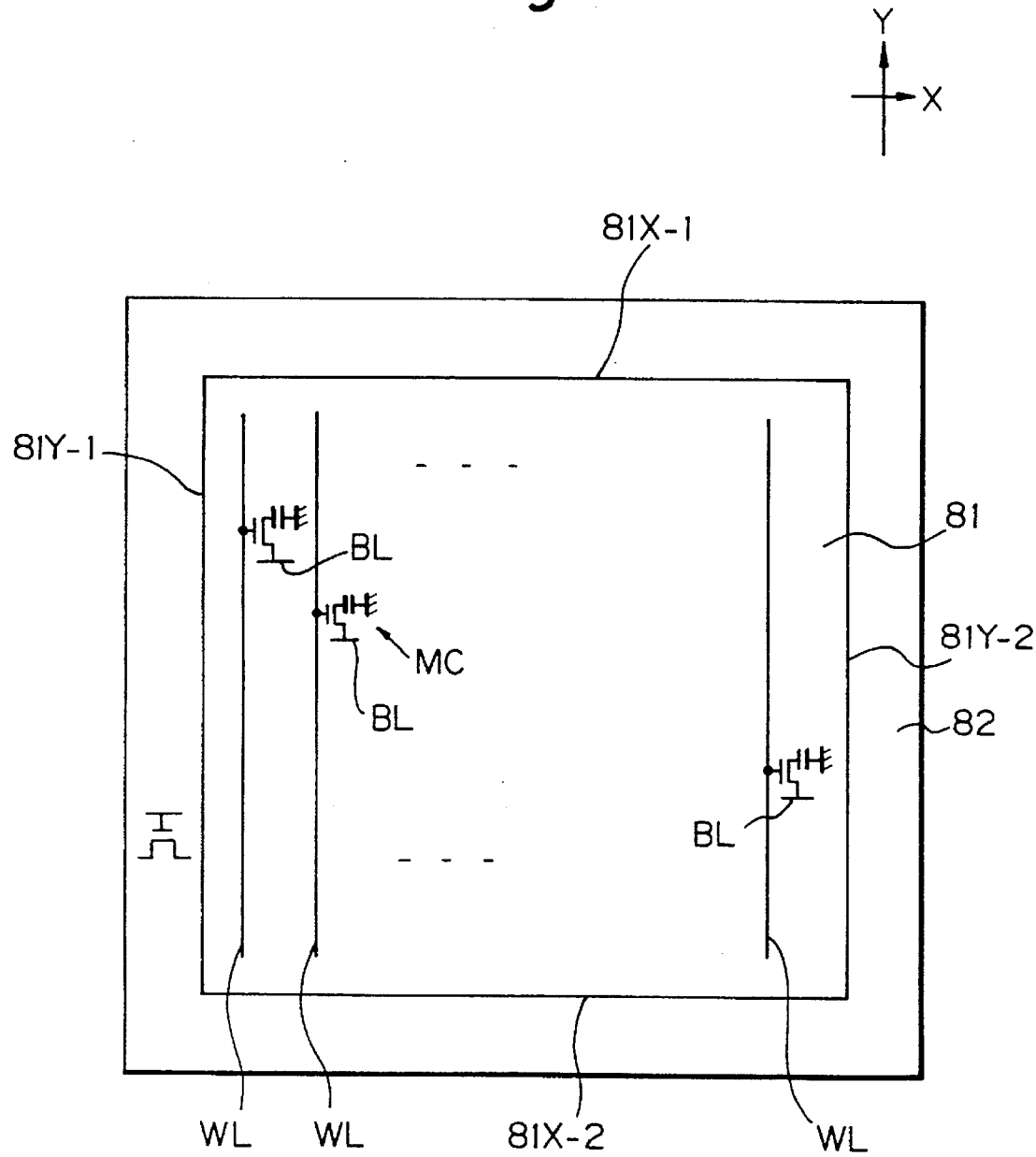

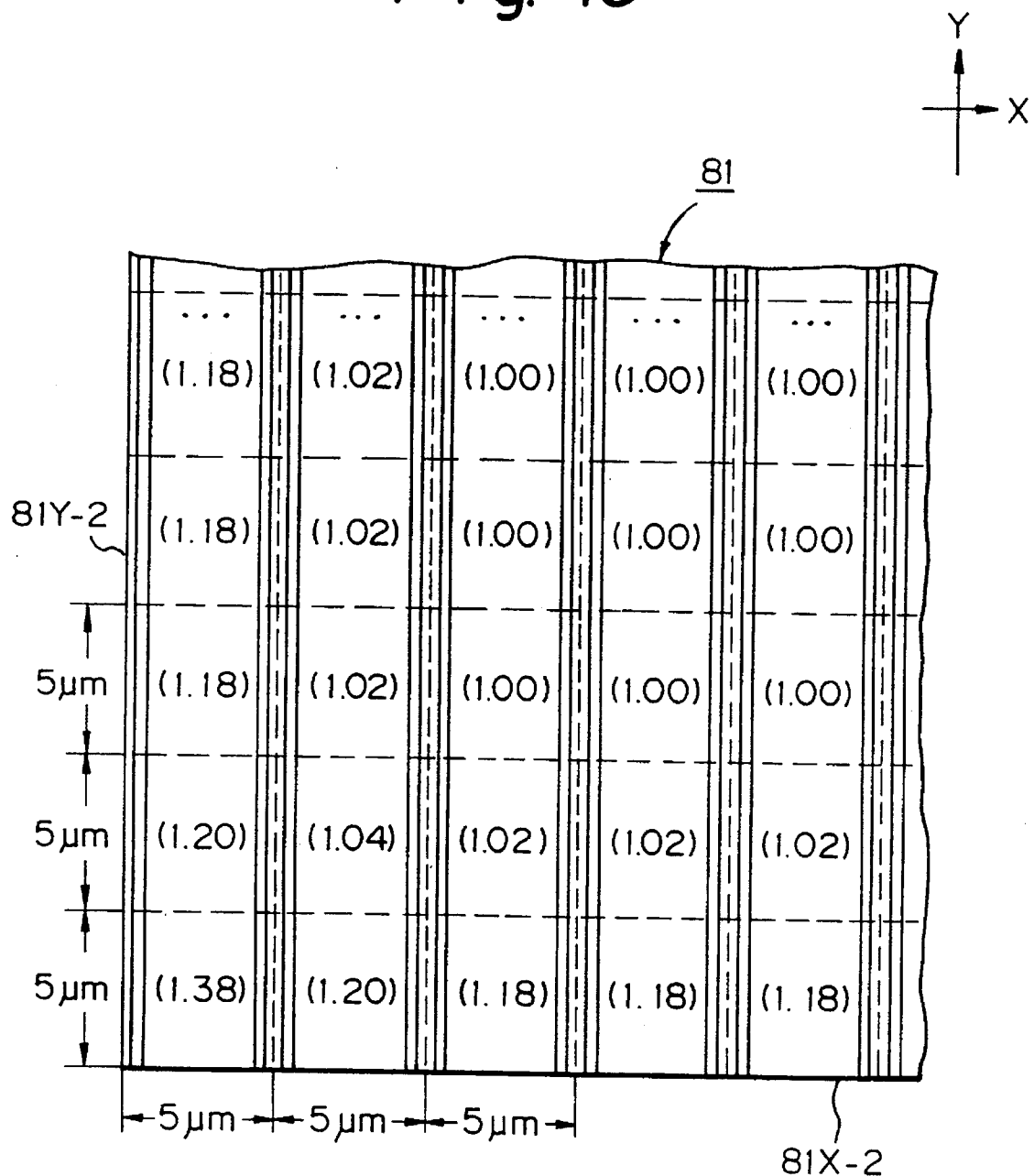

ELECTRON BEAM EXPOSURE SYSTEM CAPABLE OF CORRECTING PROXIMITY EFFECT

BACKGROUND OF THE INVENTION

1. Field of the Invention

The present invention relates to an electron beam exposure system where an electron beam is irradiated onto a target through a mask having a plurality of repetitive pattern openings, and the electron beam having the plurality of repetitive patterns after having passed through the mask is irradiated onto the target.

2. Description of the Related Art

In a first prior art electron beam exposure system, a variable-shaped beam has been used. That is, a first mask having a first rectangular opening, a second mask having a second rectangular opening, and deflection units arranged between the first and second masks are provided. An electron beam passes through the first rectangular opening of the first mask and the second rectangular opening of the second mask, to form a rectangular cross-section of the electron beam. This rectangular cross-section of the electron beam is varied by the deflection units, to obtain a variable rectangular cross-section of the electron beam. This will be explained later in detail.

In the first prior art electron beam exposure system using a variable shaped electron beam, however, when exposing a plurality of the same patterns such as cells of a dynamic random access memory (DRAM) device, a large number of deflecting operations are required, which reduces the throughput of the system.

In order to enhance the throughput of the system, a second prior art electron beam exposure system using an electron beam having a bundle of patterns is known (see FIG. 3 of JP-A-HEI 3-174716). That is, an electron beam is irradiated onto a mask having a plurality of patterns, and the electron beam having that plurality of patterns after having passed through this mask is irradiated onto a target. Thus, the plurality of patterns are simultaneously exposed on the target to remarkably enhance the throughput of the system. Also, in the second prior art electron beam exposure system, shields such as fine meshes, each smaller than a resolution limit value, are provided within each pattern opening of the mask, to substantially reduce the current density of the electron beam. This will be explained later in detail. Thus, a proximity effect among the patterns due to the difference in energy deposited within a resist is corrected.

This proximity effect is explained next. Generally, the deposited energy E(r) of the electron beam within the resist is represented by the following double Gaussian expression:

$$E(r) = \frac{1}{1+\eta} \left\{ \frac{1}{\beta_f^2} \exp\left(-\frac{\beta_f^2}{r^2}\right) + \eta \frac{\beta_f^2}{\beta_b^2} \exp\left(-\frac{\beta_b^2}{r^2}\right) \right\} \quad (1)$$

where r is a distance between a calculated point and an irradiation point of the electron beam;

$\beta_f$ is a forward-scattering range due to the electron scattering within the resist;

$\beta_b$ is a backscattering range due to the electron scattering from the boundary between the resist and its underlying substrate; and $\eta$ is a ratio of the energy deposited by backscattering to the energy deposited by forward-scattering.

Even in the above-described second prior art beam exposure system, when the target has a plurality of the same patterns whose number is not a multiple of the number of the patterns of the mask, the first prior art electron beam system using a variable-rectangular electron beam has to be used for peripheral portions of the target, thus reducing the throughput of the system.

Also, the shields provided within each of the pattern openings of the mask for correcting the proximity effect are very difficult to manufacture. Also, the shields lower the mechanical strength of the mask.

SUMMARY OF THE INVENTION

It is an object of the present invention to enhance the throughput of an electron beam exposure system suitable for irradiating a plurality of repetitive patterns such as cells of a DRAM device by easily equalizing the energy deposited in a resist of a target.

According to the present invention, in an electron beam exposure system, an electron beam is adjusted and is irradiated onto a number of pattern openings of a mask. The electron beam passed through the number of the pattern openings is deflected by deflection units and is irradiated onto a resist-coated target. The target is divided into a plurality of sub areas whose size corresponds to the size of the pattern openings. Exposure times are calculated for the sub areas so that energy deposited in the resist of the target is brought close to a definite energy.

Thus, the doses of the sub areas irradiated by the electron beam are changed in accordance with exposure portions of the target. As a result, the difference in energy of the electron beam deposited within a resist due to the forward-scattering and the back scattering can be equalized, i.e., the proximity effect can be corrected.

Also, no shields for correcting the proximity effect are provided within each of the pattern openings of the mask. Therefore, the mechanical strength of the mask can be increased.

BRIEF DESCRIPTION OF THE DRAWINGS

The present invention will be more clearly understood from the description as set forth below, as compared with the prior art, with reference to the accompanying drawings, wherein:

FIG. 3 is a plan view illustrating a DRAM device for explaining the proximity effect;

FIGS. 4A, 4B, 5A and 5B are cross-sectional views of the DRAM device of FIG. 3;

FIG. 8 is a plan view illustrating a DRAM device to which the operation as shown in FIG. 7 is applied;

FIG. 13 is a plan view of a DRAM device for explaining step 704 of FIG. 7;

DESCRIPTION OF THE PREFERRED EMBODIMENTS

Before the description of the preferred embodiments, prior art electron beam exposure systems will be explained with reference to FIGS. 1 and 2.

Figure 1:
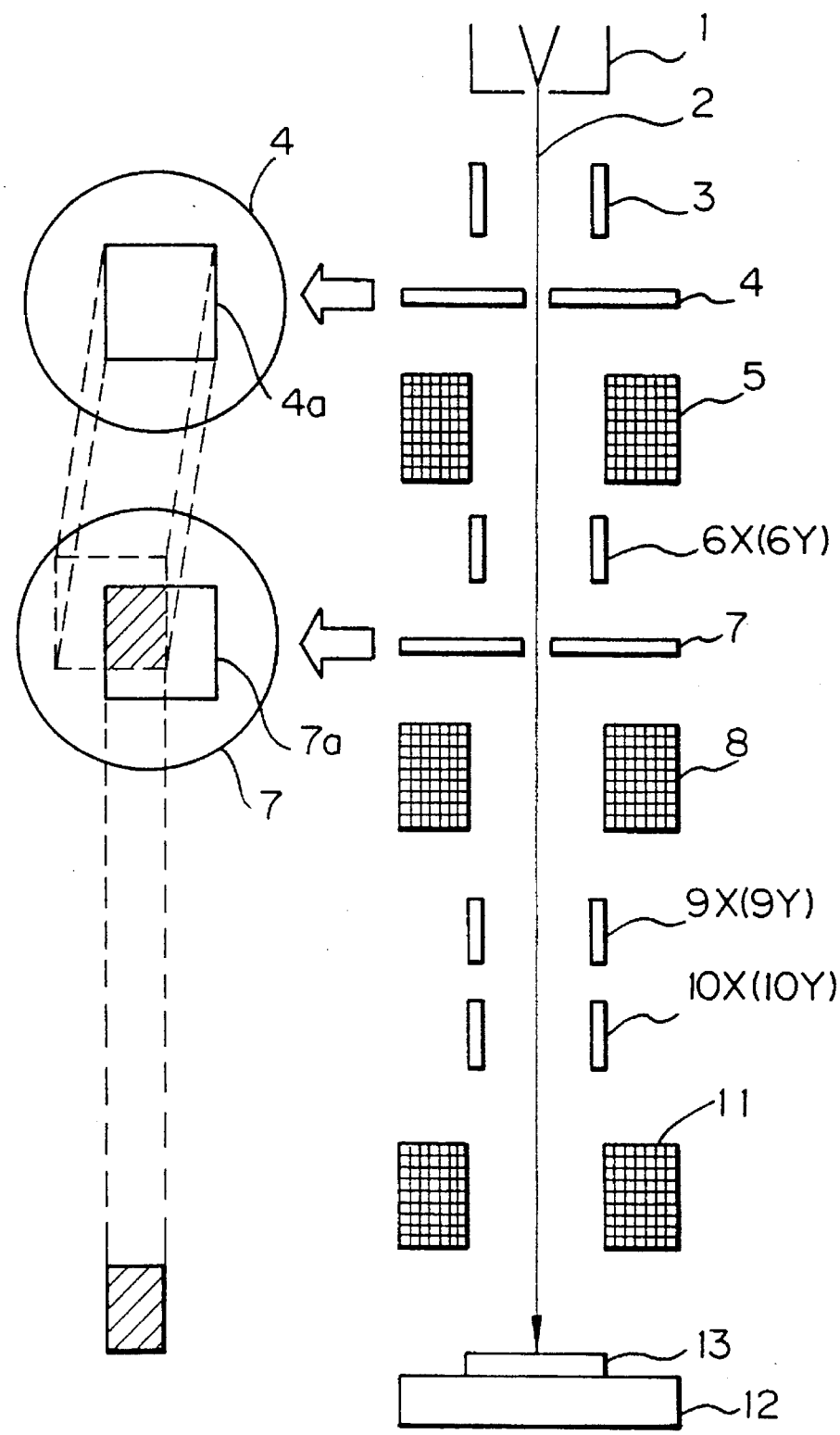
FIG. 1 is a schematic view illustrating a first prior art electron beam exposure system.

In FIG. 1, which illustrates a prior art electron beam system using a variable-shaped electron beam, reference numeral 1 designates an electron gun for emitting an electron beam 2. The electron beam 2 passes through blanking electrodes 3, and further passes through a rectangular opening 4a of a mask (aperture means) 4. The electron beam 2 further passes through a lens 5 and deflection units 6X and 6Y composed of electrostatic plates to reach a mask (aperture means) 7.

The mask 7 also has a rectangular opening 7a. Therefore, a rectangular shape of the electron beam 2 can be adjusted by the deflection units 6X and 6Y.

The electron beam 2 passed through the rectangular opening 7a of the mask 7 passes through a demagnifying lens 8, main deflection units 9X and 9Y composed of electrostatic coils, sub deflection units 10X, 10Y composed of electrostatic plates, and a demagnifying lens 11 which is called a projecting lens, and is irradiated onto a resist-coated target 13 mounted on a stage 12.

The deflection units 9X and 9Y and the deflection units 10X and 10Y are controlled, to thereby repeat a shot (deflection operation). Thus, latent images are formed in the resist of the target 13.

In the prior art electron beam exposure system as illustrated in FIG. 1, since an dose of each rectangular area can be adjusted, the proximity effect can be easily corrected. However, as stated above, when exposing a plurality of the same patterns such as cells of a DRAM device, a large number of deflecting operations are required, which reduces the throughput of the system.

Figure 2:
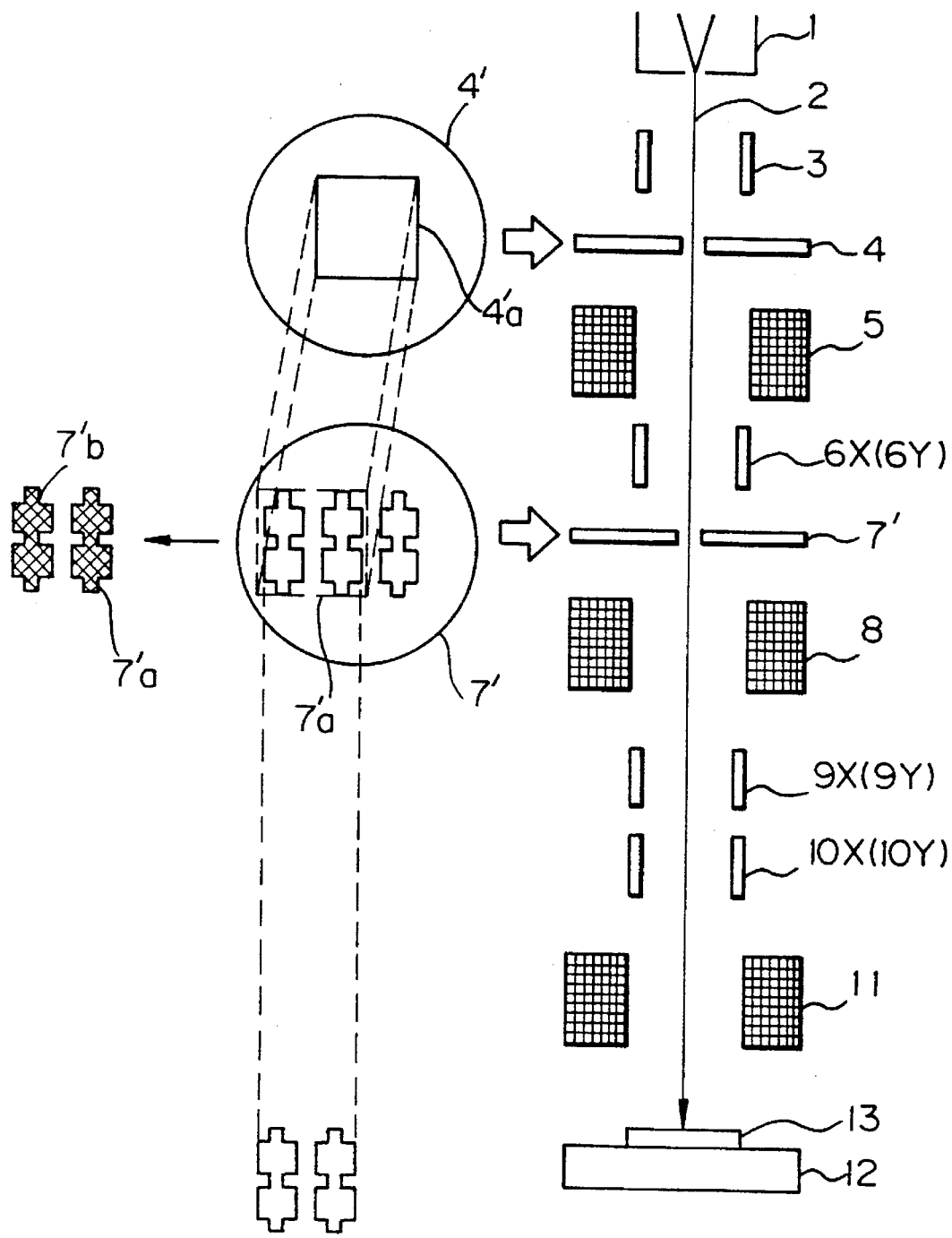
FIG. 2 is a schematic view illustrating a second prior art electron beam exposure system.

In FIG. 2, which illustrates another prior art electron beam system using an electron beam having a bundle of patterns, a mask 7' having a plurality of repetitive pattern openings 7'a is provided instead of the mask 7 of FIG. 1.

When carrying out a control of a bundle of a plurality of repetitive patterns, the deflection units 9X and 9Y and the deflection units 10X and 10Y are controlled, so that the electron beam 2 passed through the rectangular opening 4'a of the mask 4 is irradiated onto the entire area of the openings 7'a. Also, fine meshes 7'b, each smaller than a resolution limit value, are provided within the openings 7'a to substantially reduce the current density of the electron beam 2. Thus, the proximity effect can be corrected, which is helpful in reduction of the blurring of the beam.

For example, as illustrated in FIG. 3, a DRAM device is formed by a memory cell array 31 including a large number of word lines, a large number of bit lines and memory cells at intersections between the word lines and the bit lines, and a peripheral circuit 32 including address buffers, and address decoders and the like. Note that the peripheral circuit 32 is irradiated by using a variable-shaped beam.

Even in the memory cell array 31, the density of the word lines is different. For example, the density of the word lines is low at a portion A since the peripheral circuit 32 is present adjacent thereto, while the density of the word lines is high at a portion B since the peripheral circuit 32 is not present adjacent thereto. That is, as illustrated in FIGS. 4A and 4B, a silicon oxide layer 312 is formed on a silicon substrate 311, a conductive layer 313 is deposited on the silicon oxide layer 312, and a negative type resist layer 314 is coated thereon. In order to pattern the conductive layer 313, when electrons having the same current density and the same exposure time are irradiated, energy deposited in the resist layer 314 at the portion A is smaller than energy deposited in the resist layer 314 at the portion B. As a result, a width W1 of a latent image for one word line at the portion A is smaller than a width W2 of a latent image for one word line at the portion B. Therefore, after developing the latent images, and etching conductive layer 313 with am ask of the latent images, a width W1 of one word line at the portion A becomes smaller than a width W2 of one word line at the portion B. This is opposite for a case where a positive type resist layer is used. That is, the width W1 becomes larger than the width W2.

In the above-described second prior art electron beam exposure system as illustrated in FIG. 2, the fine meshes 7'b are provided in the mask 7' for the portion B, which increases the manufacturing cost and lowers the mechanical strength of the mask 7'. Also, if pattern openings of the mask 7' for the portion A are made different from pattern openings of the mask 7' for the portion B, the manufacturing steps are increased, thus increasing the manufacturing cost.

Figure 6:
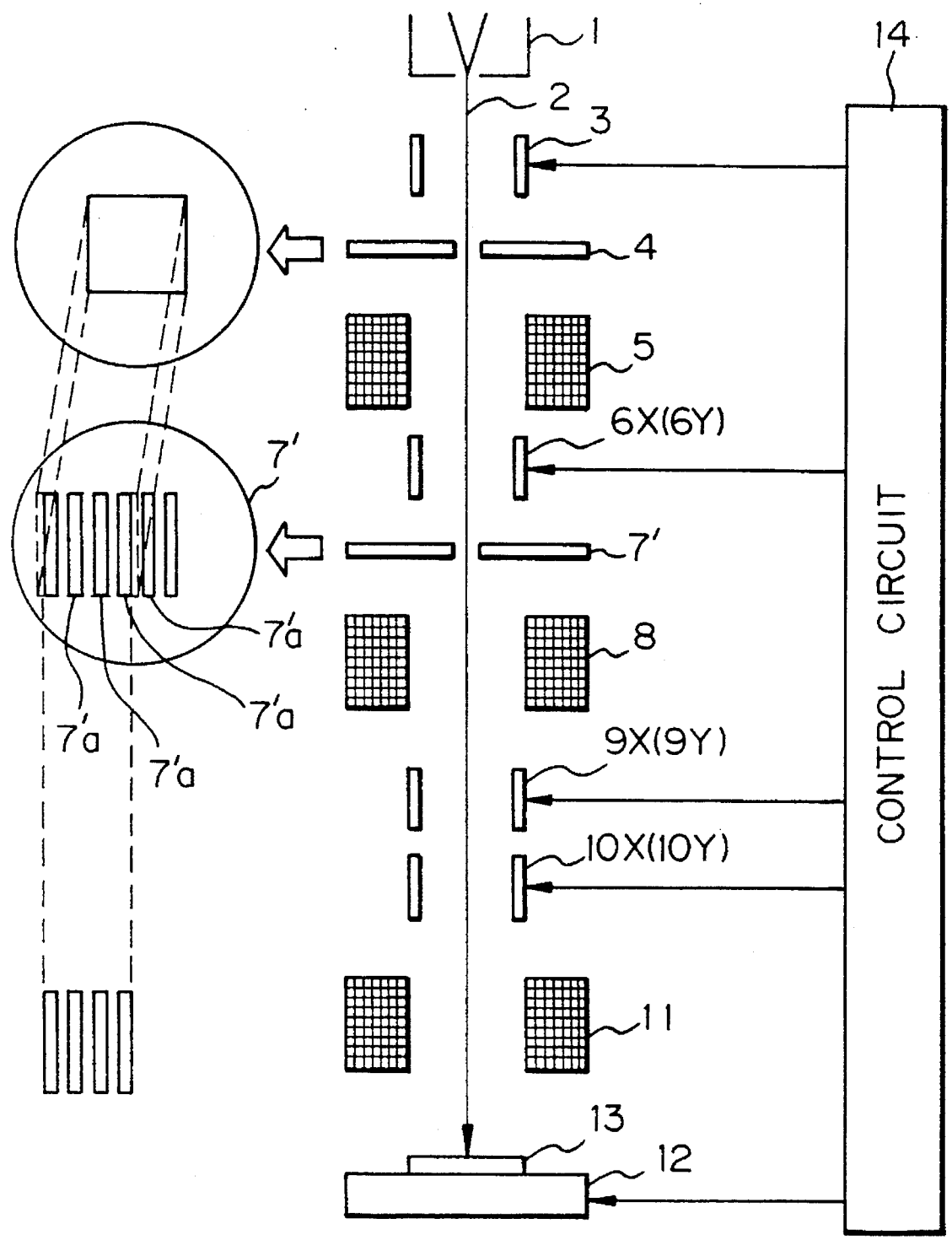
FIG. 6 is a schematic view illustrating an embodiment of the electron beam exposure system according to the present invention.

In FIG. 6, which illustrates an embodiment of the electron beam exposure system according to the present invention, this system is basically the same as that of FIG. 2. That is, a control circuit 14 for controlling the blanking electrodes 3, the deflection units 6X and 6Y, the main deflection units 9X and 9Y, and the sub deflection units 10X and 10Y is illustrated. The operation of the control circuit 14 is different from that of a control circuit (not shown) of FIG. 2. The control circuit 14 is comprised of a microcomputer or the like.

Figure 7:
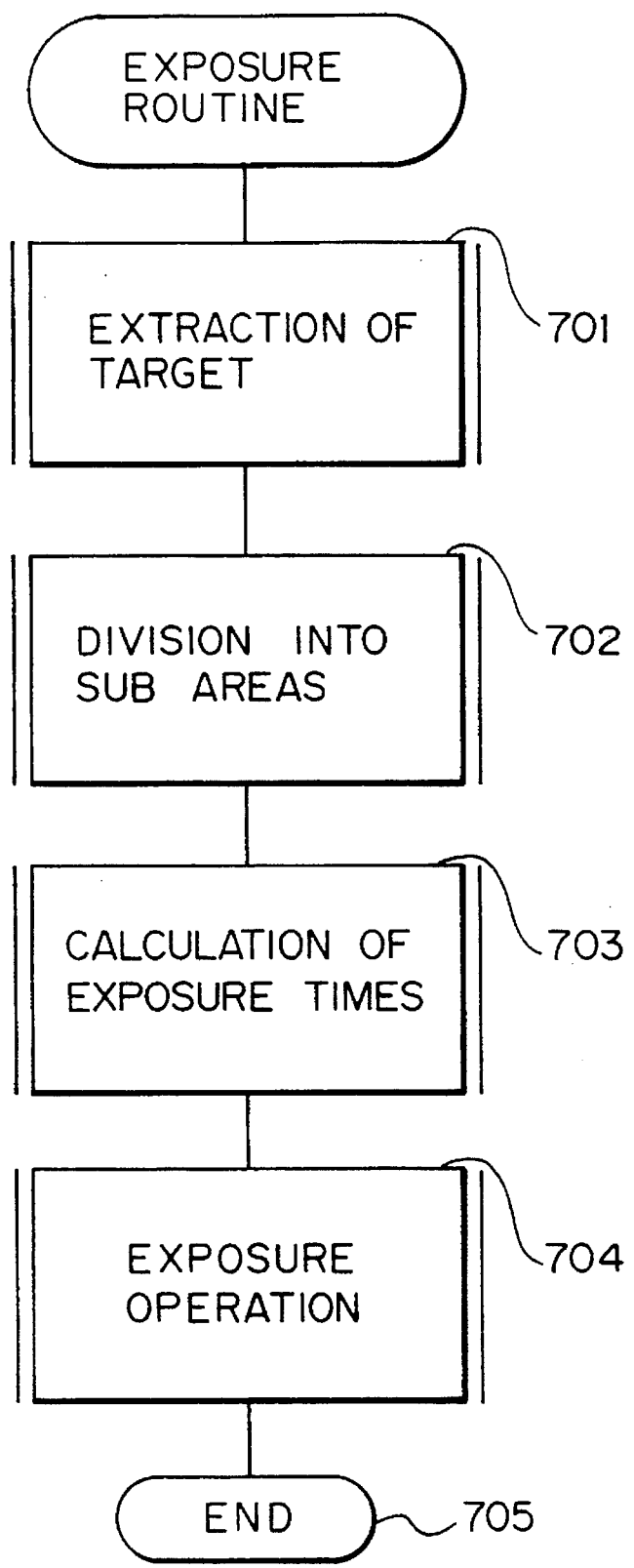
FIG. 7 is a flowchart showing an operation of the control circuit of FIG. 6.

An operation of the control circuit 14 of FIG. 6 is shown in FIG. 7. This operation is applied to a DRAM device as illustrated in FIG. 8. That is, this DRAM device is formed by a memory cell array 81 and a peripheral circuit 82. The memory cell array 81 includes a large number of parallel word lines WL, a large number of parallel bit lines BL, and memory cells MC located at intersections between the word lines WL and the bit lines BL. Also, the memory cell array 81 is defined by edges 81X-1 and 81X-2 and edges 81Y-1 and 81Y-2. Also, referring to FIG. 9A which is a partial enlargement of the DRAM device of FIG. 8, and FIG. 9B which is a cross-sectional view taken along the line B—B of FIG. 9A, a silicon oxide layer 812 is formed on a silicon substrate 811, a conductive layer 813 is formed, and a 0.7 μm thick negative type resist layer 814 is coated thereon.

Figure 9A:
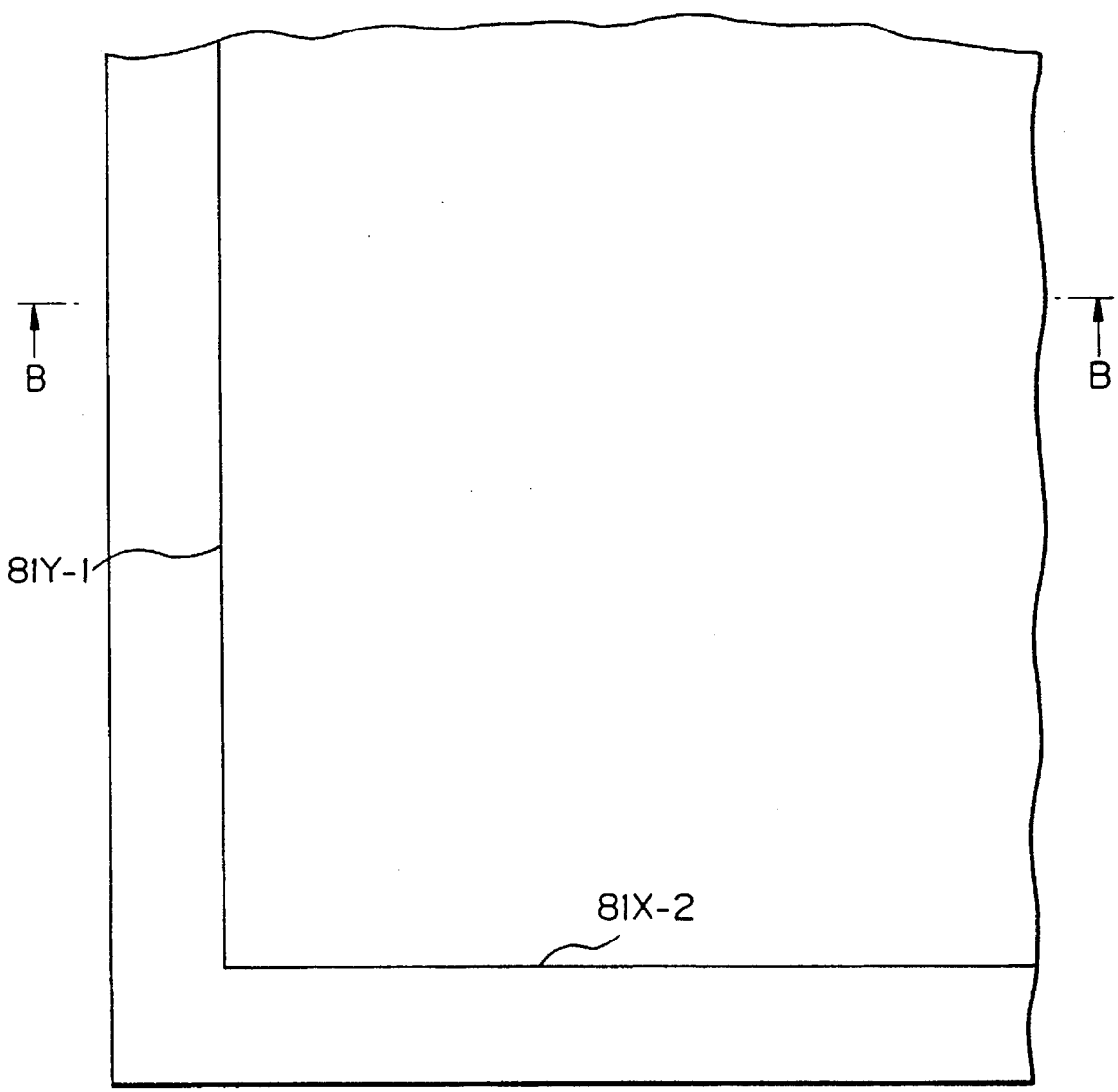
FIGS. 9A and 9B are detailed plan and cross-sectional views of the DRAM device of FIG. 8.
Figure 9B:
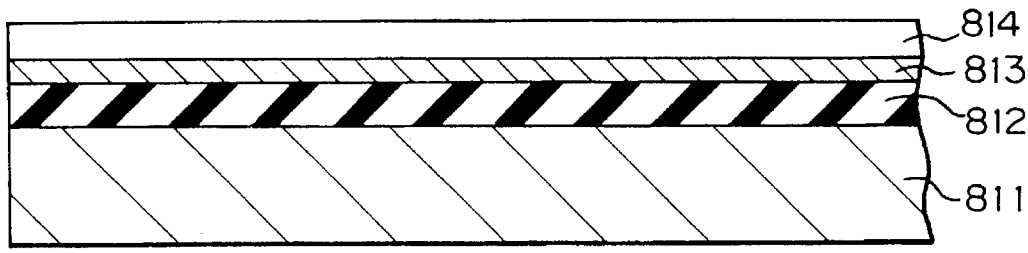
Figure 10:
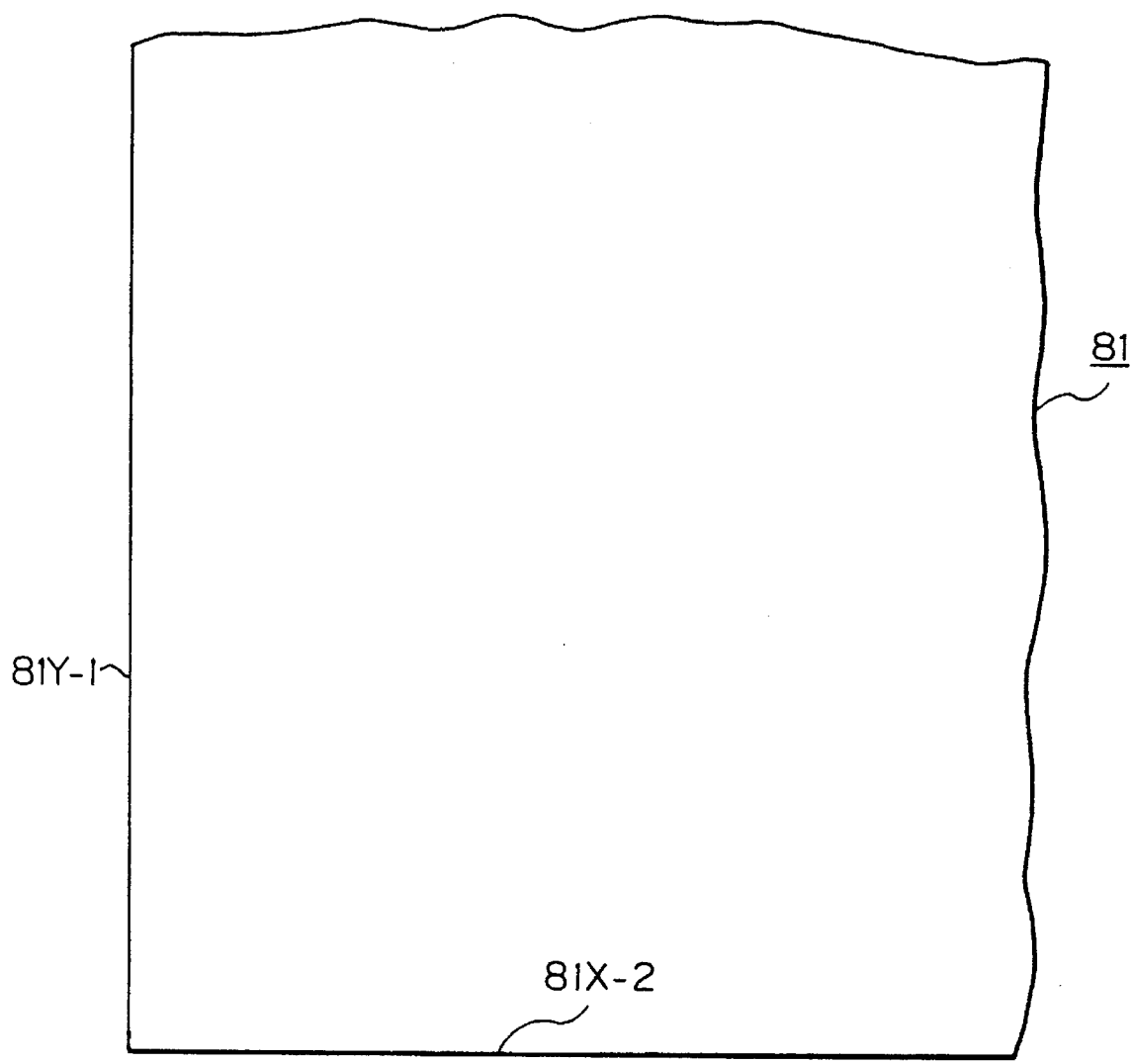
FIG. 10 is a plan view of a DRAM device for explaining step 701 of FIG. 7.
Figure 11:
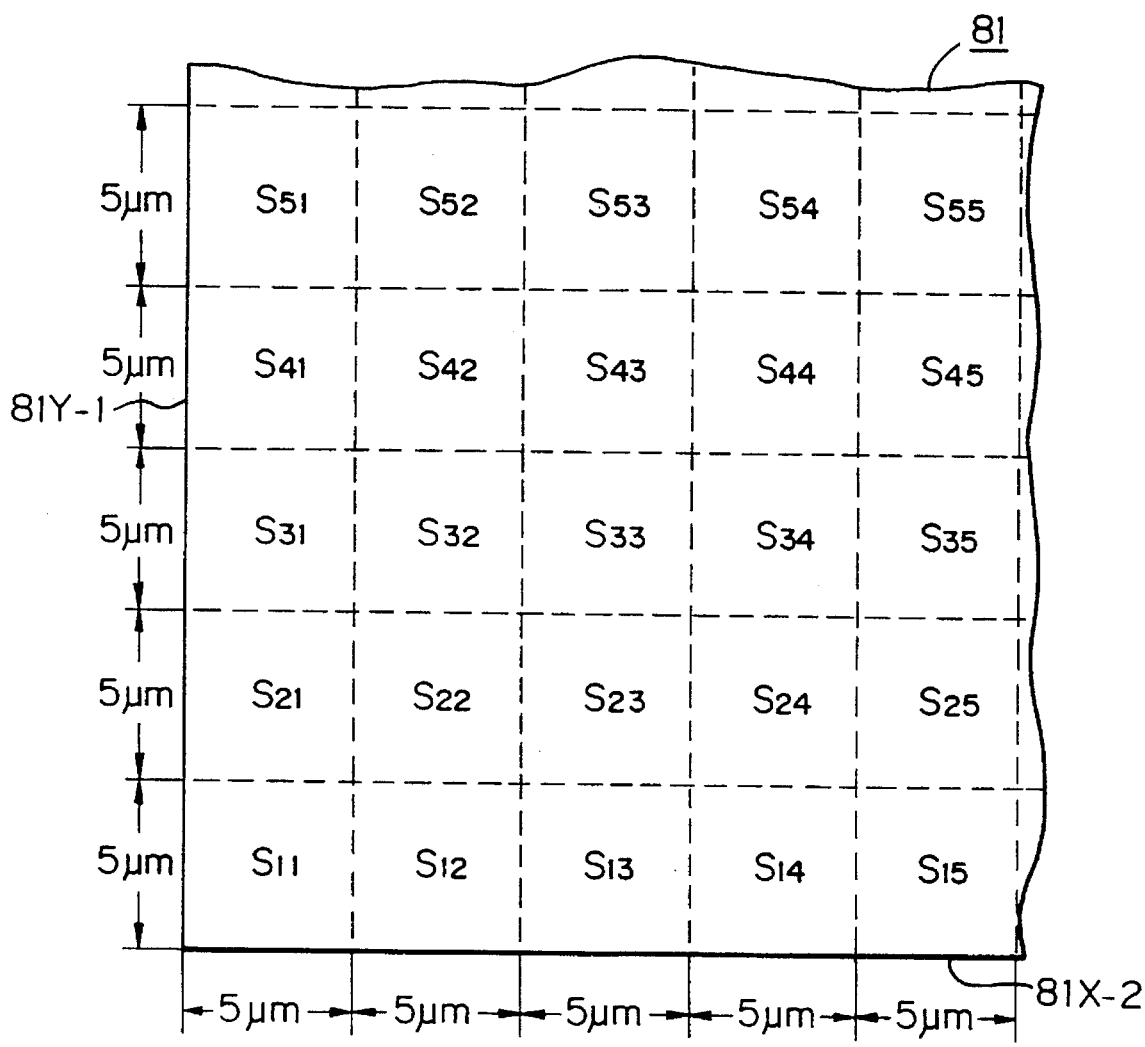
FIG. 11 is a plan view of a DRAM device for explaining step 702 of FIG. 7.

First, at step 701, extraction of a target which is, in this case, the DRAM as illustrated in FIGS. 8, 9A and 9B, is carried out. That is, as illustrated in FIG. 10, a region of the memory cell array 81 defined by the edges 81X-1, 81X-2, 81Y-1 and 81Y-2 is extracted.

Next, at step 702, the extracted region 81 is divided into a plurality of sub areas $S_{11}, S_{12}, \ldots$ having the same size, such as 5 μm×5 μm.

Next, at step 703, doses for the sub areas $S_{11}, S_{12}, \ldots$ are calculated. In this case, when the current density of the electron beam 2 is definite, exposure times for the sub areas $S_{11}, S_{12}, \ldots$ are calculated as shown in FIG. 12.

Figure 12:
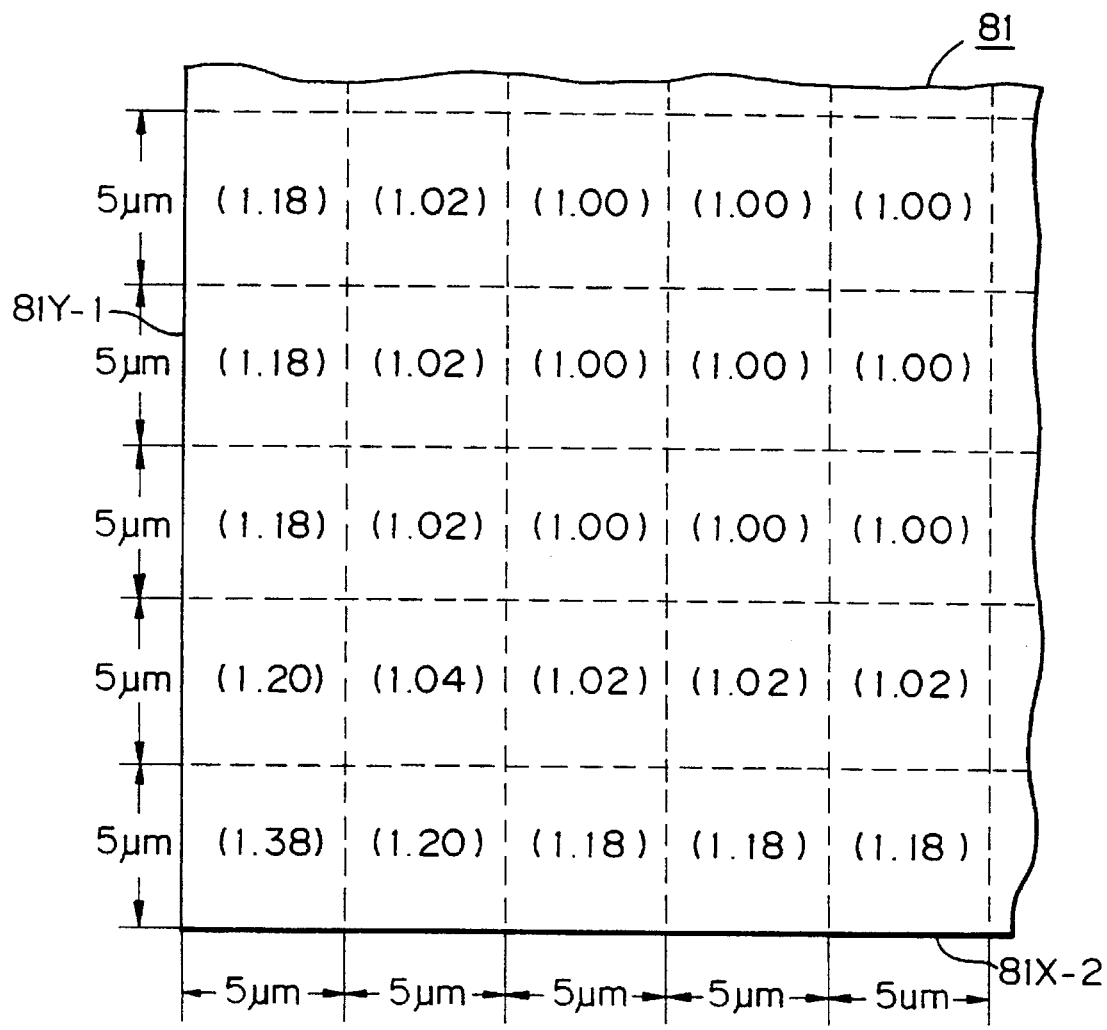
FIG. 12 is a plan view of a DRAM device for explaining step 703 of FIG. 7.

In FIG. 12, the acceleration voltage of electrons of the electron beam 2 is 50 keV, and as a result, the backscattering range $\beta_b$ is about 10 μm. Therefore, in the sub areas $S_{33}, S_{34}, \ldots S_{43}, S_{44}, \ldots, S_{53}, S_{54}, \ldots$, which are distant by 10 μm or more from the edges 81Y-1 and 81X-2, energy deposited in the resist is almost constant, and therefore, the dose for these sub areas is, for example, $(1.00) = 23$ μC/cm$^2$.

The sub areas $S_{32}, S_{42}, S_{52}, \ldots, S_{23}, S_{24}, S_{25}, \ldots$ are affected a little by the exterior of the edge 81Y-1 or 81X-2. Therefore, the dose for these sub areas is $(1.02) = 23.46$ μC/cm$^2$.

The sub area $S_{22}$ is affected a little by the exterior of both the edges 81Y-1 and 81X-2. Therefore, the dose for the sub area $S_{22}$ is $(1.04) = 23.92$ μC/cm$^2$.

The sub areas $S_{31}, S_{41}, S_{51}, \ldots, S_{13}, S_{14}, S_{15}, \ldots$ are affected remarkably by the exterior of the edge 81Y-1 or 81X-2. Therefore, the dose for these sub areas is $(1.18) = 27.14$ μC/cm$^2$.

The sub area $S_{11}$ is affected remarkably by the exterior of both the edges 81Y-1 and 81X-2. Therefore, the dose for the sub area $S_{11}$ is $(1.38) = 31.74$ μC/cm$^2$.

Finally, at step 704, the electron beam 2 having passed through the openings 7'a of the mask 7 is controlled by the deflection units 9X, 9Y, 10X and 10Y and is irradiated onto the sub areas of the target 12 in accordance with the doses calculated at step 703.

Then, at step 705, the routine of FIG. 7 is completed.

Figure 14A:
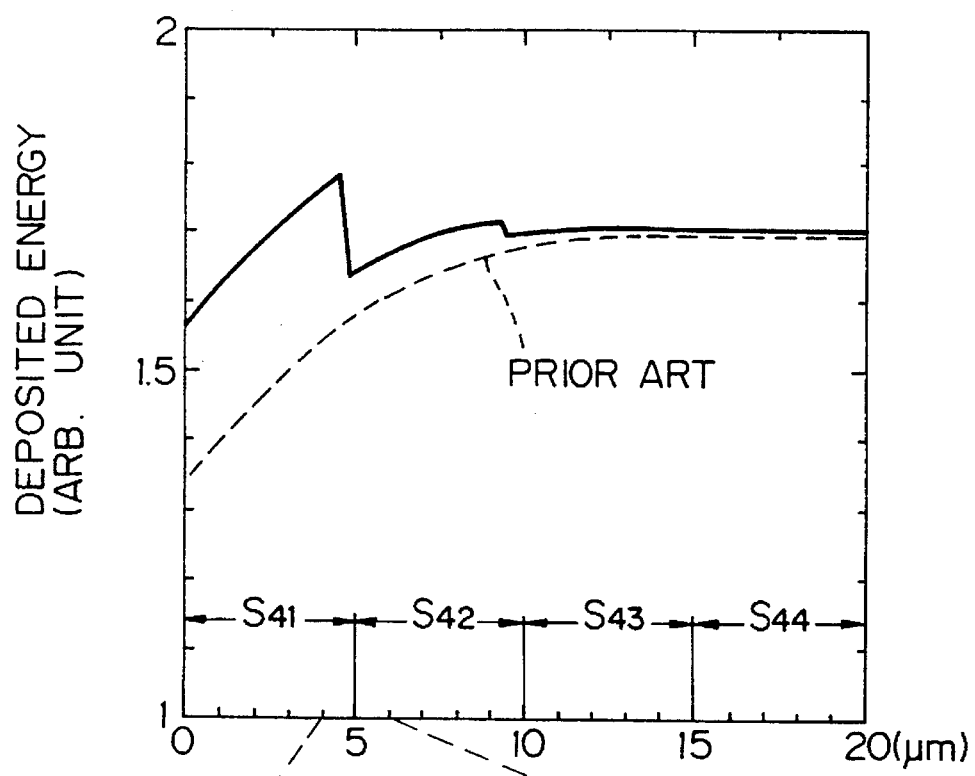
FIGS. 14A and 14B are diagrams showing the deposited energy obtained by the routine of FIG. 7.
Figure 14B:
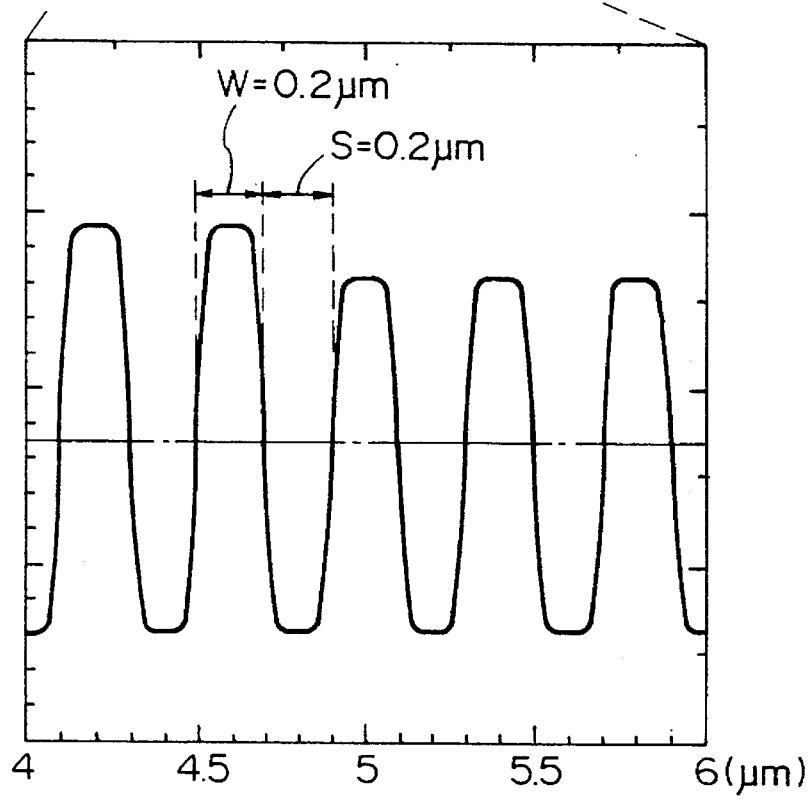

The deposited energy calculated based upon the doses of FIG. 12 by using the formula (1) is obtained as shown in FIG. 14A and FIG. 14B which is a partial enlargement of FIG. 14A. In this case, a width W of a latent image for one word line is 0.2 μm and a space S between the latent images is 0.2 μm. As shown in FIGS. 14A and 14B, the difference in deposited energy is remarkably reduced as compared with the prior art where the same dose is allocated to all the sub areas. Thus, the latent images become uniform, and accordingly, the word lines become uniform.

Figure 15:
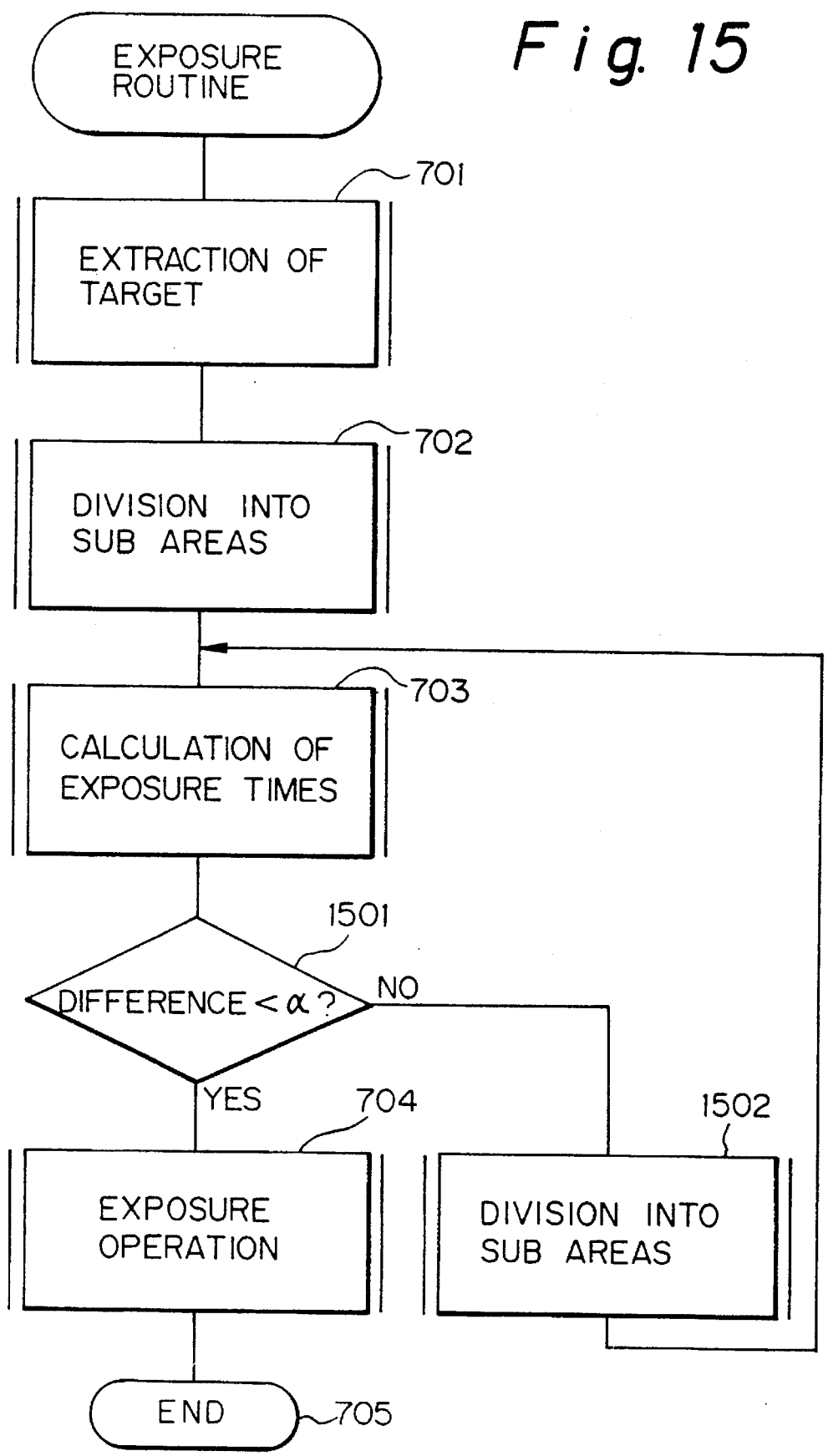
FIG. 15 is a flowchart showing another operation of the control circuit of FIG. 6.

In FIG. 15, which shows another operation of the control circuit 14 of FIG. 6, steps 1501 and 1502 are added to the routine of FIG. 7. That is, at step 1501, it is determined whether or not the difference in deposited energy between the latent images is smaller than a definite energy α. For example, it is determined whether or not the deposited energy in the sub areas $S_{31}, S_{41}, \ldots, S_{13}, S_{14}, S_{15}, \ldots$ facing the edges 81Y-1 and 81X-2 is deviated greatly from the deposited energy in a centered sub area such as $S_{44}$. As a result, if the difference in deposited energy between the latent images is smaller than the definite value α, the control proceeds to step 704. Otherwise, the control proceeds to step 1502.

Figure 16:
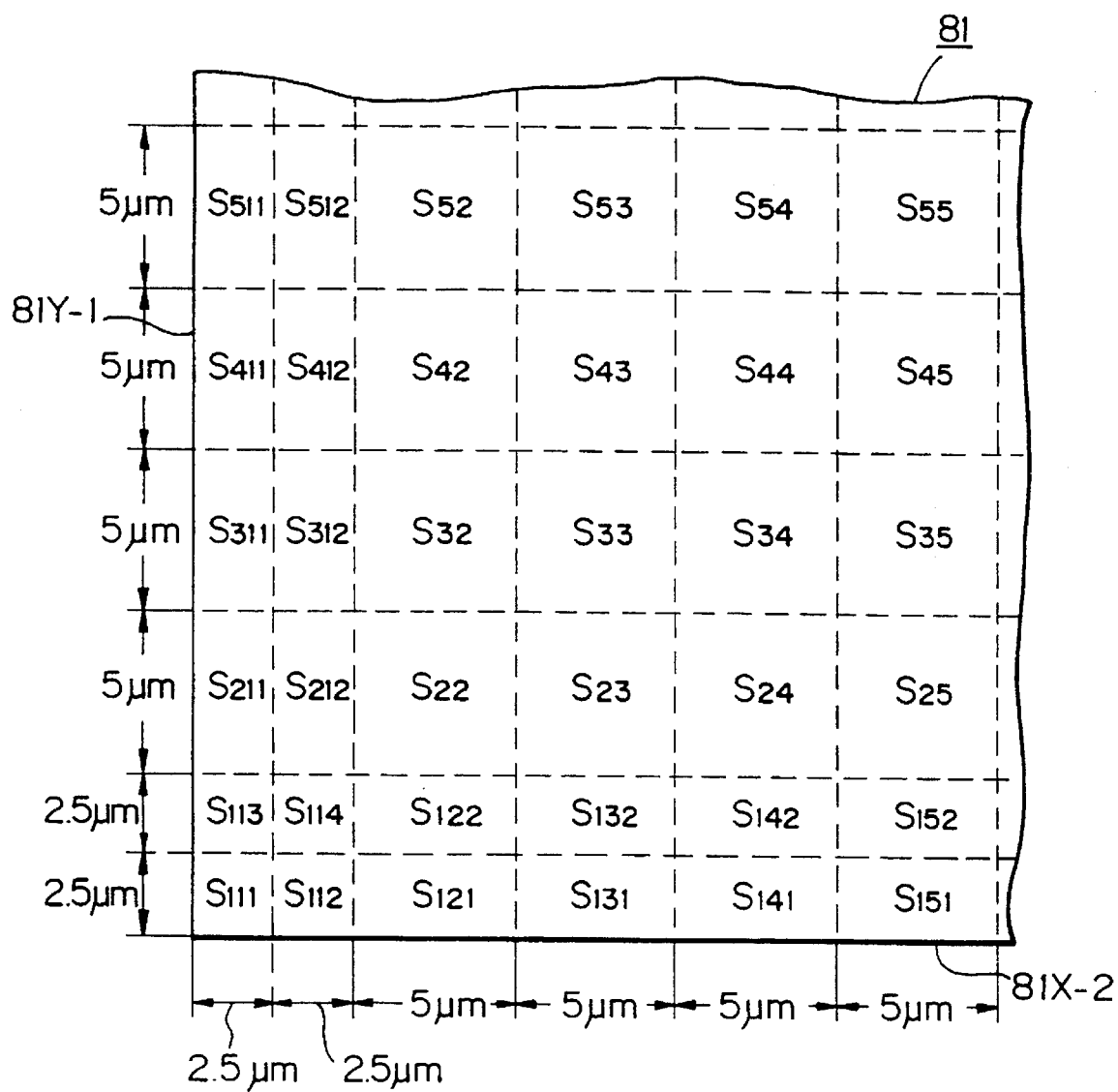
FIG. 16 is a plan view of a DRAM device for explaining steps 1502 of FIG. 15.

At step 1502, the extracted region 81 is redivided. For example, as shown in FIG. 16, the sub areas $S_{11}, S_{21}, S_{31}, \ldots, S_{12}, S_{13} \ldots$ facing the edges 81Y-1(81Y-2) and 81X-2(81X-1) are further divided into sub areas $S_{111}, S_{112}, S_{113}, S_{114}, S_{211}, S_{212}, \ldots$ having a size of 2.5 μm×5 μm. Then, the control returns to step 703.

Figure 17:
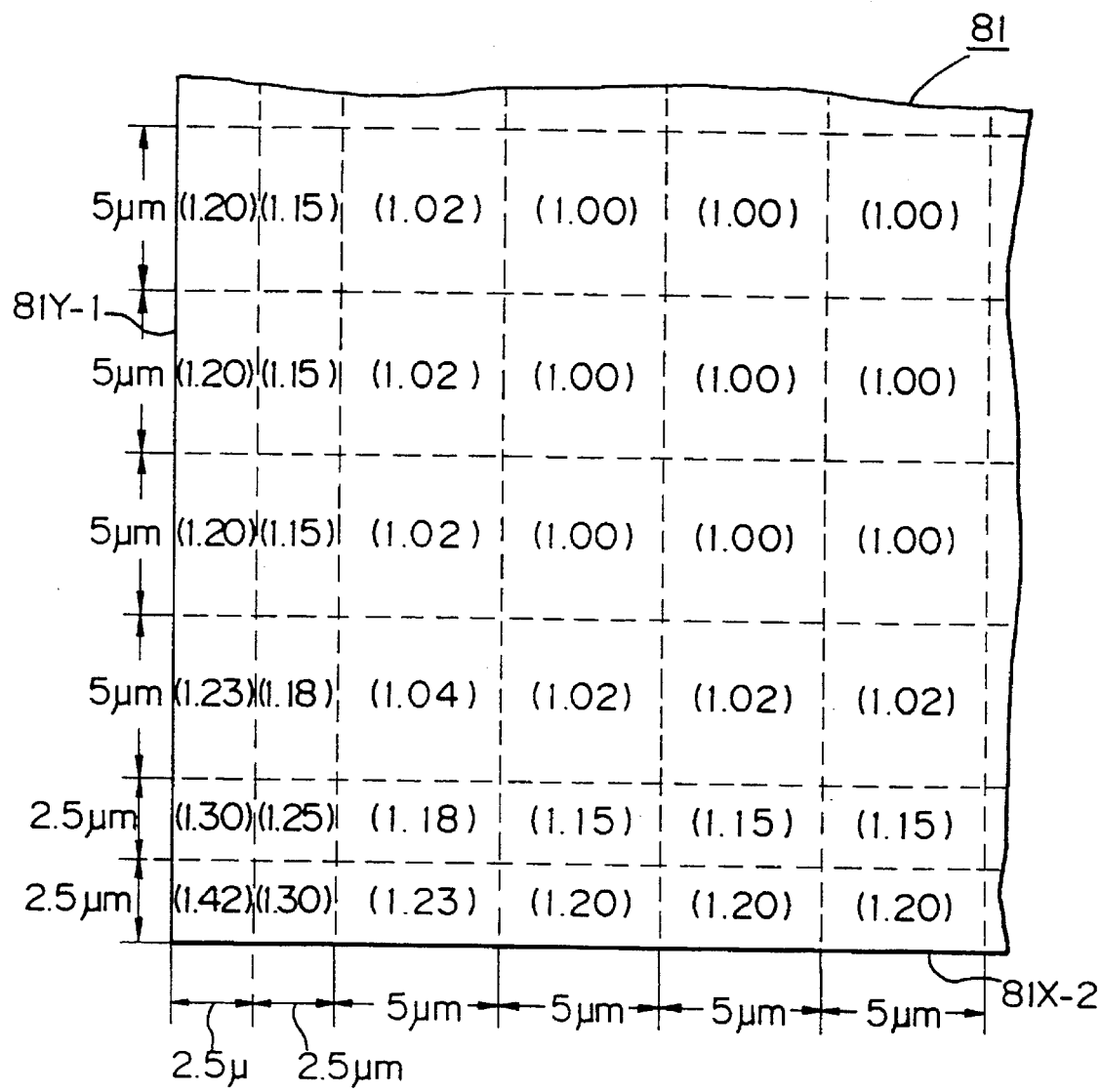
FIG. 17 is a plan view of a DRAM device for explaining step 703 of FIG. 15.

Again, at step 703, doses for the sub areas are calculated. In this case, as shown in FIG. 17, the doses for the new sub areas $S_{111}, S_{112}, S_{113}, S_{114}, S_{211}, S_{212}, \ldots$ are calculated. Then, the control proceeds via step 1501 to step 704.

Figure 18:
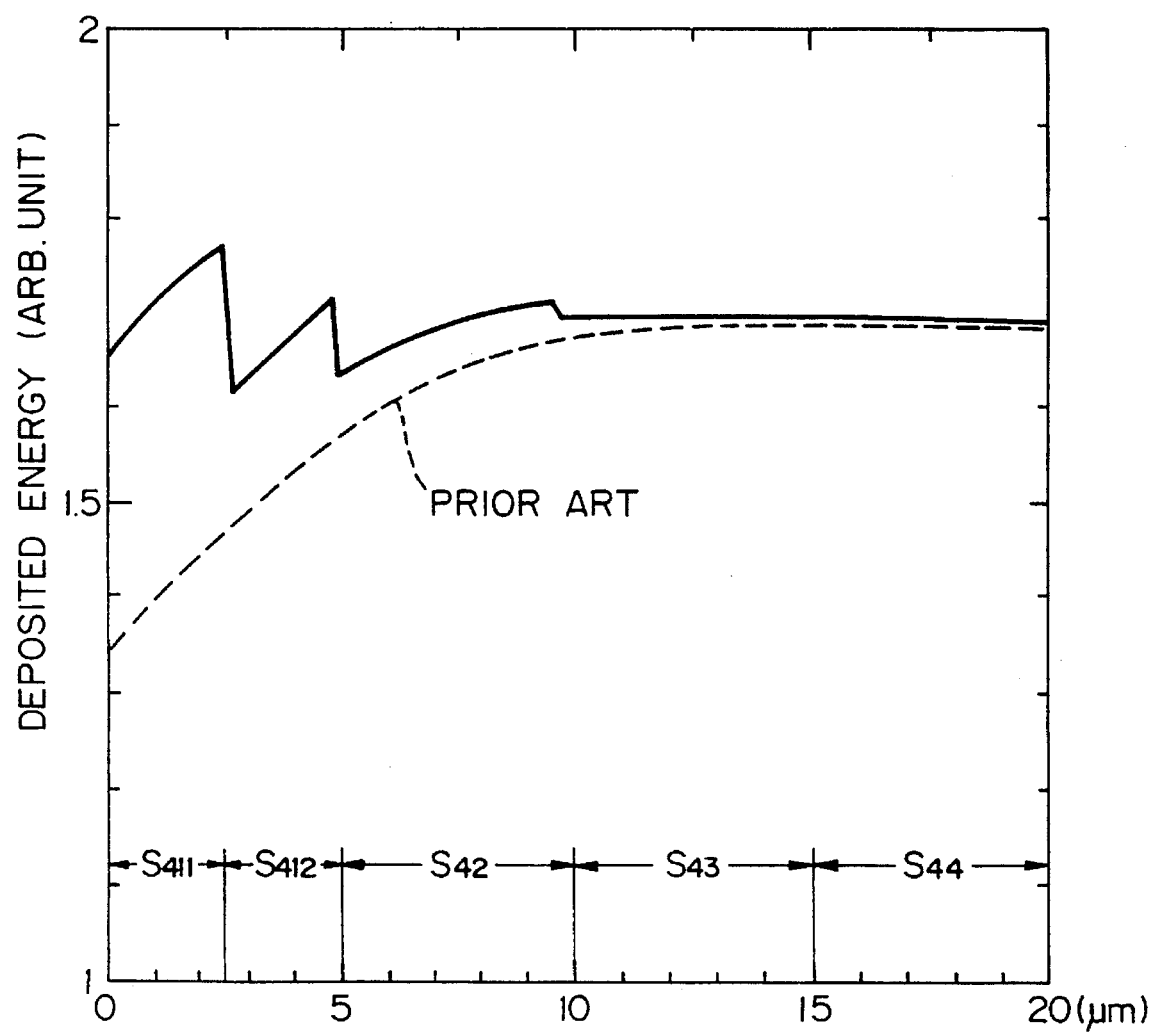
FIG. 18 is a diagram showing the deposited energy obtained by the routine of FIG. 15.

The deposited energy calculated based upon the doses of FIG. 17 by using the formula (1) is obtained as shown in FIG. 18. As shown in FIG. 18, the difference in deposited energy is reduced as compared with that of FIG. 14A. Thus, the latent images become more uniform, and accordingly, the word lines become more uniform.

As explained hereinbefore, according to the present invention, the energy deposited in a resist of a target can be uniform while enhancing the throughput of the system.

I claim:

1. An electron beam exposure system including: electron beam emitting means for emitting an electron beam having a definite current density; aperture means having a plurality of repetitive pattern openings; first deflecting means, arranged between said electron beam emitting means and said aperture means, for irradiating said electron beam onto a number of said repetitive pattern openings; and second deflecting means for deflecting said electron beam through said number of said repetitive pattern openings onto a resist-coated target, said system comprising:

means for dividing an area of said resist-coated target into a plurality of sub areas having the same size, and corresponding to said number of said repetitive pattern openings;

means for calculating a respective exposure time for each of said plurality of sub areas, each said respective exposure time being calculated so that energy deposited in said resist-coated target is substantially constant; and means for driving said second deflecting means to irradiate said electron beam through said number of said repetitive pattern openings onto each of said plurality of sub areas of said resist-coated target in accordance with each said respective time.

2. The system as set forth in claim 1, wherein said exposure times calculating means calculates said exposure times so that a respective one of said exposure times for one of said sub areas at a peripheral portion of said target is larger than a respective one of said exposure times for one of said sub areas at a center portion of said target.

3. The system as set forth in claim 2, wherein said exposure times calculating means calculates said exposure times so that a respective one of said exposure times for one of said sub areas at a corner portion of said target is larger than a respective one of said exposure times for one of said sub areas at a peripheral portion of said target.

4. The system as set forth in claim 1, wherein said exposure times calculating means calculates said exposure times so that respective ones of said exposure times for said sub areas apart from an edge of said target by a backscattering range of electrons are a definite value and respective ones of said exposure times for said sub areas close to the edge of said target are gradually increased as compared with said definite value.

5. An electron beam exposure system including: electron beam emitting means for emitting an electron beam having a definite current density; aperture means having a plurality of repetitive pattern openings; first deflecting means, arranged between said electron beam emitting means and said aperture means, for irradiating said electron beam onto a number of said repetitive pattern openings; and second deflecting means for deflecting said electron beam through said number of said repetitive pattern openings onto a resist-coated target, said system comprising:

means for dividing an area of said resist-coated target into a plurality of sub areas whose size is larger at a center portion of said resist-coated target than at a peripheral portion of said resist-coated target;

means for calculating a respective exposure time for each of said plurality of sub areas, each said respective exposure time being calculated so that energy deposited in said resist-coated target is substantially constant;

means for driving said first deflecting means to adjust the number of said repetitive pattern openings irradiated by said electron beam in accordance with a respective size of said plurality of sub areas; and means for driving said second deflecting means to irradiate said electron beam through said number of said repetitive pattern openings onto each of said plurality of sub areas of said resist-coated target in accordance with each said respective exposure time.

6. The system as set forth in claim 5, wherein said exposure times calculating means calculates said exposure times so that a respective one of said exposure times for one of said sub areas at a peripheral portion of said target is larger than a respective one of said exposure times for one of said sub areas at a center portion of said target.

7. The system as set forth in claim 6, wherein said exposure times calculating means calculates said exposure times so that a respective one of said exposure times for one of said sub areas at a corner portion of said target is larger than a respective one of said exposure times for one of said sub areas at a peripheral portion of said target.

8. An electron beam exposure system including: electron beam emitting means for emitting an electron beam; aperture means having a plurality of repetitive pattern openings; first deflecting means, arranged between said electron beam emitting means and said aperture means, for irradiating said electron beam onto a number of said repetitive pattern openings; and second deflecting means for deflecting said electron beam through said number of said repetitive pattern openings onto a resist-coated target, said system comprising:

means for dividing an area of said resist-coated target into a plurality of sub areas having the same size, and corresponding to said number of said repetitive pattern openings;

means for calculating a respective dose for each of said plurality of sub areas, each said respective dose being calculated so that energy deposited in said resist-coated target is substantially constant; and means for driving said second deflecting means to irradiate said electron beam through said number of said repetitive pattern openings onto each of said plurality of sub areas of said resist-coated target in accordance with each said respective dose.

9. An electron beam exposure system including: electron beam emitting means for emitting an electron beam; aperture means having a plurality of repetitive pattern openings; first deflecting means arranged between said electron beam emitting means and said aperture means, for irradiating said electron beam onto a number of said repetitive pattern openings; and second deflecting means for deflecting said electron beam through said number of said repetitive pattern openings onto a resist-coated target, said system comprising:

means for dividing an area of said resist-coated target into a plurality of sub areas whose size is larger at a center portion of said resist-coated target than at a peripheral portion of said resist-coated target;

means for calculating a respective dose for each of said plurality of sub areas, each said respective dose being calculated so that energy deposited in said resist-coated target is substantially constant;

means for driving said first deflecting means to adjust the number of said repetitive pattern openings irradiated by said electron beam in accordance with a respective size of said sub areas; and means for driving said second deflecting means to irradiate said electron beam through the number of said repetitive pattern openings onto each of said plurality of sub areas of said resist-coated target in accordance with each said respective dose.

* * * * *